United States Patent
Nasu et al.

(10) Patent No.: US 9,430,071 B2
(45) Date of Patent: Aug. 30, 2016

(54) RESIN COMPOSITION, AND TRANSPARENT MEMBRANE FOR TOUCH PANEL SENSORS AND TOUCH PANEL USING SAME

(71) Applicant: DNP FINE CHEMICALS CO., LTD., Kanagawa (JP)

(72) Inventors: Shintaro Nasu, Tokyo-to (JP); Satoshi Shioda, Kanagawa (JP); Hiroshi Takeichi, Kanagawa (JP)

(73) Assignee: DNP FINE CHEMICALS CO., LTD., Yokohama-shi, Kanagawa (JP)

( * ) Notice: Subject to any disclaimer, the term of this patent is extended or adjusted under 35 U.S.C. 154(b) by 0 days.

(21) Appl. No.: 14/389,073

(22) PCT Filed: Mar. 28, 2013

(86) PCT No.: PCT/JP2013/059275
§ 371 (c)(1),
(2) Date: Sep. 29, 2014

(87) PCT Pub. No.: WO2013/147028
PCT Pub. Date: Oct. 3, 2013

(65) Prior Publication Data
US 2015/0116234 A1    Apr. 30, 2015

(30) Foreign Application Priority Data
Mar. 30, 2012  (JP) ................. 2012-082945

(51) Int. Cl.
| | |
|---|---|
| C08L 83/04 | (2006.01) |
| G06F 3/041 | (2006.01) |
| C08F 230/08 | (2006.01) |
| G03F 7/027 | (2006.01) |
| C08F 283/12 | (2006.01) |
| G03F 7/038 | (2006.01) |
| G03F 7/075 | (2006.01) |
| H05K 3/28 | (2006.01) |
| H05K 1/02 | (2006.01) |
| H05K 1/03 | (2006.01) |

(52) U.S. Cl.
CPC ............ *G06F 3/041* (2013.01); *C08F 230/08* (2013.01); *C08F 283/12* (2013.01); *C08L 83/04* (2013.01); *G03F 7/027* (2013.01); *G03F 7/038* (2013.01); *G03F 7/0757* (2013.01); *H05K 3/287* (2013.01); *G06F 2203/04112* (2013.01); *H05K 1/0274* (2013.01); *H05K 1/0326* (2013.01); *H05K 1/0346* (2013.01); *H05K 2201/0108* (2013.01); *H05K 2201/0162* (2013.01); *H05K 2201/0326* (2013.01)

(58) Field of Classification Search
CPC .... C08G 77/20; C08G 18/615; C08G 18/61; C08L 83/00
See application file for complete search history.

(56) References Cited

U.S. PATENT DOCUMENTS

2011/0230584 A1* 9/2011 Araki ................. C08F 290/148
522/99

FOREIGN PATENT DOCUMENTS

| | | |
|---|---|---|
| JP | 2008-225136 A | 9/2008 |
| KR | 20110097767 A | 8/2011 |
| WO | 2010061744 A1 | 6/2010 |
| WO | 2011114884 A1 | 9/2011 |

OTHER PUBLICATIONS

International Search Report Dated Jun. 13, 2013; PCT/JP2013/059275.

* cited by examiner

*Primary Examiner* — Kuo-Liang Peng
(74) *Attorney, Agent, or Firm* — Ladas & Parry LLP

(57) ABSTRACT

The present invention has a main purpose of providing a resin composition capable of forming a resin film excellent in hardness and heat resistance. To achieve the purpose described above, the present invention provides a resin composition, comprising: a developable polysiloxane containing a developable group and substantially no radically polymerizable group; a polymerizable polysiloxane containing a radically polymerizable group and substantially no developable group; and a polyfunctional monomer.

2 Claims, 3 Drawing Sheets

RESIN COMPOSITION, AND TRANSPARENT MEMBRANE FOR TOUCH PANEL SENSORS AND TOUCH PANEL USING SAME

TECHNICAL FIELD

The present invention relates to a resin composition capable of forming a resin film excellent in hardness and heat resistance.

BACKGROUND ART

A resin composition capable of forming a transparent membrane having light transmission is widely used in formation of optical instruments.

A UV curing type resin composition having an acrylate type material as a main component disclosed in Patent Literature 1 is herein widely used as a resin composition.

Organic materials of acrylate type materials and the like however, have, problems of being difficult in providing sufficient hardness. There is therefore a problem such as follow is caused, when the acrylate type material is used for a protective layer and the like provided on the surface of optical instruments, in some cases, sufficient scratch resistance cannot be obtained.

To solve these problems, Patent Literature 2 discloses an inorganic type resin composition containing inorganic materials as a main component and further having the patterning ability. Use of the inorganic type resin composition described above can provide sufficient hardness, thereby forming a transparent film excellent in scratch resistance when used for a protective layer of optical instruments and the like.

However, the inorganic type resin composition described above is, insufficient in heat resistance and generates a problem of which exposure to high temperature in a manufacture process of optical instruments and in their use results in reduction of transparency by discoloration and decrease of functionality.

For example, an optical instrument such as a touch panel uses in some cases a transparent electrode as an electrode. Heretofore, such a transparent electrode is generally heat-treated around 230° C. in manufacturing process. However, for example, to reduce a resistance value of the transparent electrode, a high temperature treatment (annealing) step at high temperature of 250° C. to 300° C. is performed to make the electric current sufficiently flow through a thin wire along with thinning of the wire and the film thickness of the transparent electrode in recent years. With a resin film using a conventional inorganic type resin composition, even if the composition do not cause yellowing, peeling and poor adhesion in heat treatment at 230° C., the composition becomes to have a problem of causing yellowing and poor adhesion in the heat treatment step at high temperature of 250° C. to 300° C.

CITATION LIST

Patent Literature

Patent Literature 1: Japanese Patent Application Publication (JP-A) No. 2008-225136
Patent Literature 2: WO 2010061744

SUMMARY OF INVENTION

Technical Problem

The present invention was performed in view of problems described above and has a main purpose of providing a resin composition capable of forming a resin film excellent in hardness and heat resistance.

Solution to Problem

To solve problems described above, the present invention provides a resin composition, comprising: a developable polysiloxane containing a developable group and substantially no radically polymerizable group; a polymerizable polysiloxane containing a radically polymerizable group and substantially no developable group; and a polyfunctional monomer.

According to the present invention, a resin film excellent in heat resistance can be formed by containing both the developable polysiloxane and the polymerizable polysiloxane described above.

In the present invention, the polyfunctional monomer described above is preferably a compound having the triazine ring skeleton. A reason is that a resin film excellent in adhesion and resistance to yellowing can be formed even after the resin composition described above is heat-treated at high temperature of 250° C. or above.

In the present invention, a resin composition preferably has a phosphate compound. A reason is that the phosphate compound can make a resin film excellent in adhesion to a transparent electrode material such as ITO.

In the present invention, a resin composition preferably contains a refractive index enhancement agent. A reason is that the refractive index enhancement agent can make high the refractive index of the resin film formed using the resin composition of the present invention. A reason is that for example, when the resin film described above is stacked on the transparent electrode formed using the transparent electrode material such as ITO, a pattern of the transparent electrode described above can be made invisible.

The present invention provides a transparent membrane for a touch panel characterized in that the transparent membrane for a touch panel is formed using a resin composition, and the resin composition has a developable polysiloxane containing a developable group and substantially no radically polymerizable group, a polymerizable polysiloxane containing a radically polymerizable group and substantially no developable group, and a polyfunctional monomer.

According to the present invention, since a resin film is formed using the resin composition described above, excellent adhesion can be obtained and little yellowing occurs even after a heat treatment step at high temperature of 250° C. or above.

The present invention provides a touch panel comprising: a transparent substrate; and a sensor electrode formed on the transparent substrate described above, characterized in that the touch panel has the transparent membrane for a touch panel formed using a resin composition, and the resin composition has a developable polysiloxane containing a developable group and substantially no radically polymerizable group, a polymerizable polysiloxane containing a radically polymerizable group and substantially no developable group, and a polyfunctional monomer.

According to the present invention, since a transparent membrane for a touch panel is formed using the resin composition described above, a member formed using such a transparent membrane for a touch panel can be made excellent in heat resistance.

Advantageous Effects of Invention

The present invention generates effects in which a resin composition capable of forming a resin film excellent in hardness and heat resistance can be provided.

DESCRIPTION OF EMBODIMENTS

Figure 1:
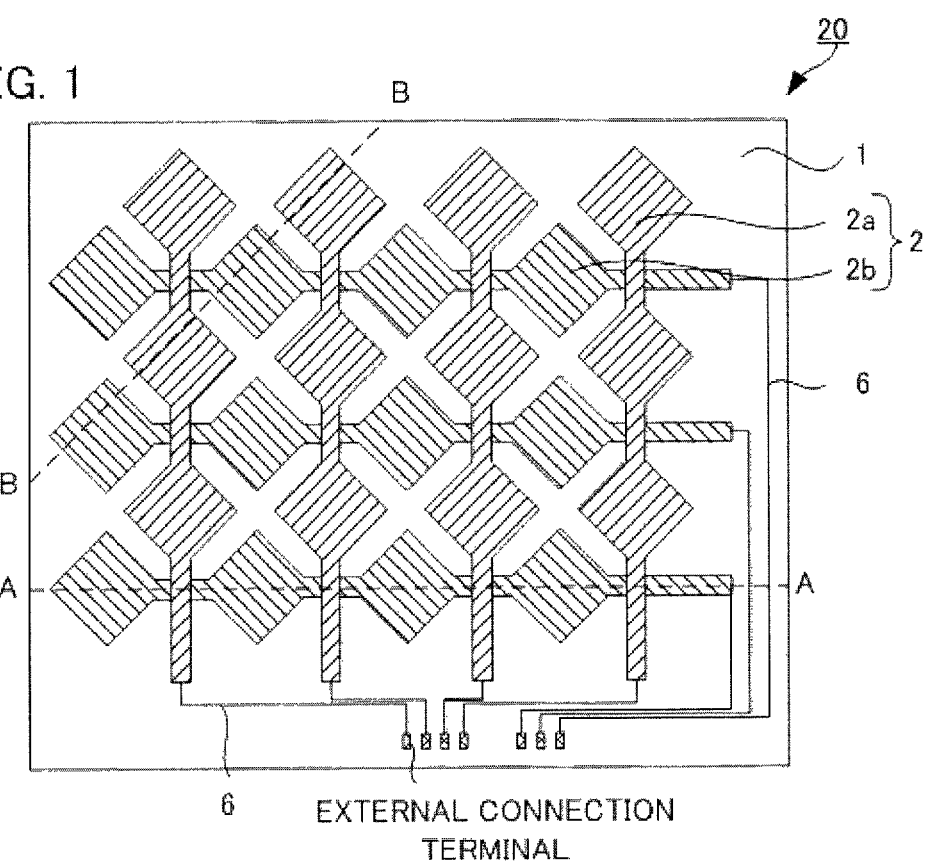
FIG. 1 is a schematic plan view of illustrating an example of a touch panel in the present invention.

The present invention relates to a resin composition, a transparent membrane for a touch panel using the same, and a touch panel using the transparent membrane for a touch panel.

Hereinafter, the resin composition, the transparent membrane for a touch panel, and the touch panel in the present invention will be described.

A. Resin Composition

At first, a resin composition of the present invention will be described below.

A resin composition of the present invention comprises a developable polysiloxane containing a developable group and substantially no radically polymerizable group, a polymerizable polysiloxane containing a radically polymerizable group and substantially no developable group, and a polyfunctional monomer.

According to the present invention, a resin film excellent in heat resistance can be formed by containing both the developable polysiloxane and the polymerizable polysiloxane described above.

A reason that a resin film excellent in heat resistance is formed by containing both the developable polysiloxane and the polymerizable polysiloxane described above may be herein presumed as follows.

That is, the proportion of silicon atom bonded to the developable group is reduced by using a polysiloxane containing a polymerizable group such as an ethylenic unsaturated double bond together with a polysiloxane containing a developable group such as a carboxyl group as compared to a polysiloxane containing both the polymerizable group and the developable group in the molecule. As the results, it is considered that the number of silicon atoms eluted when developed, that is, the amount of polysiloxane eliminated can be reduced, thereby resulting in the shrinkage volume before and after development to be little and decreasing stress in the film after development to improve adhesion giving excellent heat resistance and adhesion after heating at high temperature.

Reactivity of silane compounds as a raw material for polysiloxanes also generally differs depending on the type of functional groups. It is, therefore, considered that independent synthesis of the polysiloxane having a double bond and the polysiloxane containing a carboxyl group makes control of the reaction in synthesis easier than the polysiloxane having both the double bond and the carboxyl group in the molecule. In the present invention, the molecular weight and the like of each polysiloxane in the developable polysiloxane and the polymerizable polysiloxane can, therefore, be accurately controlled. It is considered that this also affect for improvement of heat resistance.

A resin composition of the present invention has a developable polysiloxane, a polymerizable polysiloxane, and a polyfunctional monomer.

Hereinafter, each component of the resin composition in the present invention will be described in detail.

1. Developable Polysiloxane

A developable polysiloxane in the present invention is a polysiloxane containing the developable group and substantially no radically polymerizable group.

The term of "containing substantially no radically polymerizable group" herein means that cross-linking between developable polysiloxanes themselves and cross-liking of the developable polysiloxane with a polyfunctional monomer do not occur to the extent of which the developable property of the developable polysiloxane is impaired and parts of the developable polysiloxane not exposed to light are eliminated when developed. Specifically, the content of the constitutional unit containing the radically polymerizable group is preferably 5 mol % or less in a total constitutional unit constituting the developable polysiloxane, and among them, more preferably 3 mol % or less, in particular preferably 0 mol %, that is, no constitutional unit containing the radically polymerizable group is contained. A reason is that the excellence in both developable property and heat resistance can be obtained.

(1) Developable Group

The developable group described above is not particularly limited so far as the developable property with an aqueous developer can be improved, and includes, for example, the carboxyl group, the hydroxyl group, the phosphate group, the sulfonic acid group, and the silanol group.

Among them, the carboxyl group is preferred in the present invention. A reason is that excellent developable property can be obtained.

The hydroxyl group described above is also preferably a phenolic hydroxyl group. A reason is that excellent developable property can be obtained.

Two or more types of the developable group may be contained in a developable polysiloxane in the present invention.

Incidentally, an aqueous developer is not particularly limited so far as the developer uses water as a solvent, and includes an aqueous solution of an inorganic compound such as hydroxides, carbonates, phosphates, silicates, borates of alkali metals, a quaternary ammonium salt such as trimethylammonium hydroxide and 2-hydroxyethyltrimethylammonium hydroxide, and an amine compound such as 2-diethylaminoethanol and monoethanolamine.

The content of the constitutional unit containing the developable group described above may be adjusted such that the developable polysiloxane described above has a desired acid value.

A monomer component capable of forming the constitutional unit containing the developable group described above is not particularly limited so far as the monomer component is a silane compound capable of forming a polysiloxane.

Among them, an organosilane compound (hereinafter, referred to as a developable group-containing organosilane compound) having the developable group described above or its anhydride and having two or more alkoxy groups bonded to the silicon atom is preferred in the present invention. A reason is that use of the developable group-containing organosilane compound described above can readily yield a developable polysiloxane by its hydrolysis and polycondensation.

The alkoxy group described above includes a methoxy group, an ethoxy group, a n-propoxy group, an i-propoxy group, a n-butoxy group, a t-butoxy group, a phenoxy group, and the like; and among them, the methoxy group, the ethoxy group, the n-propoxy group, the i-propoxy group, the n-butoxy group, and particularly the methoxy group, the ethoxy group, and the like are preferred. A reason is that the presence of the functional group described above makes hydrolysis reaction in synthesis of a polysiloxane proceed smoothly as well as makes an alcohol formed easier to be distilled off from the system.

The number of alkoxy groups contained in the developable group-containing organosilane compound described above may be 2 or more, but preferably 3. A reason is that this number of the alkoxy group makes the developable polysiloxane very dense and excellent in heat resistance.

A specific example of the developable group-containing organosilane compound described above includes 3-trimethoxysilylpropylcarboxylic acid, 3-triethoxysilylpropylcarboxylic acid, 3-triphenoxysilylpropylcarboxylic acid, 3-[(trimethoxysilyl)propyl]succinic anhydride, 3-[(triethoxysilyl)propyl]suceinic anhydride, 3-[(triphenoxysilyl)propyl]succinic anhydride, 3-[(trimethoxysilyl)propyl]cyclohexylsuccinic anhydride, 3-[(trimethoxysilyl)propyl] phthalic anhydride, 2-(4-hydroxyphenyl)ethyltrimethoxysilane, 2-(4-hydroxyphenyl)ethyltriethoxysilane, 2-(4-hydroxyphenyl)ethyltripropoxysilane, 2-(4-hydroxyphenyl)ethyltributoxysilane, 3-(4-hydroxyphenyl)propyltrimethoxysilane, 3-(4-hydroxyphenyl)propyltriethoxysilane, 2-(4-hydroxyphenyl)propyltripropoxysilane, 3-(4-hydroxyphenyl)propyltributoxysilane, 2-(3-hydroxyphenyl)ethyltrimethoxysilane, 2-(3-hydroxyphenyl)ethyltriethoxysilane, 2-(3-hydroxyphenyl)ethyltripropoxysilane, 2-(3-hydroxyphenyl)ethyltributoxysilane, 3-(3-hydroxyphenyl)propyltrimethoxysilane, 3-(3-hydroxyphenyl)propyltriethoxysilane, 2-(3-hydroxyphenyl)propyltripropoxysilane, 3-(3-hydroxyphenyl)propyltributoxysilane, 2-(2-hydroxyphenyl)ethyltrimethoxysilane, 2-(2-hydroxyphenyl)ethyltriethoxysilane, 2-(2-hydroxyphenyl)ethyltripropoxysilane, 2-(2-hydroxyphenyl)ethyltributoxysilane, 3-(2-hydroxyphenyl)propyltrimethoxysilane, 3-(2-hydroxyphenyl)propyltriethoxysilane, 2-(2-hydroxyphenyl)propyltripropoxysilane, and 3-(2-hydroxyphenyl)propyltributoxysilane; and among them, preferably 3-[(trimethoxysilyl)propyl]succinic anhydride, 3-[(triethoxysilyl)propyl]succinic anhydride, 3-[(triphenoxysilyl)propyl]succinic anhydride, 3-[(trimethoxysilyl)propyl]cyclohexylsuccinic anhydride, and 3-[(trimethoxysilyl)propyl] phthalic anhydride; and particularly, [3-(trimethoxysilyl)propyl]succinic anhydride and 3-[(triethoxysilyl)propyl] succinic anhydride can be preferably used. A reason is that use of the compound described above can make reaction smoothly proceed in synthesis of the developable polysiloxane described above.

(2) Radically Polymerizable Group

A radically polymerizable group is not particularly limited so far as the functional group has a radically polymerizable property, and the group with an ethylenic unsaturated double bond is preferred. Specifically an acryloyl group, a methacryloyl group, a vinyl group, and the like can be included.

A monomer component capable of forming the constitutional unit containing the radically polymerizable group described above is not particularly limited so far as the monomer component is a silane compound capable of forming a polysiloxane.

Among them, an organosilane compound (hereinafter, referred to as a radically polymerizable group-containing organosilane compound) having the radically polymerizable group described above and having two or more alkoxy groups bonded to the silicon atom is preferred in the present invention. A reason is that use of the radically polymerizable group-containing organosilane compound described above can readily yield a developable polysiloxane by its hydrolysis and polycondensation.

The type and the number of alkoxy groups can be similar to those described in section "(1) Developable Group" described above.

A specific example of the radically polymerizable group-containing organosilane compound described above includes γ-acryloyltrimethoxysilane, γ-acryloyltriethoxysilane, γ-acryloyl(methyl)dimethoxysilane, γ-acryloyl(methyl)diethoxysilane, γ-methacryloyltrimethoxysilane, γ-methacryloyltriethoxysilane, γ-methacryloyl(methyl)dimethoxysilane, γ-methacryloyl(methyl)diethoxysilane, vinyltrimethoxysilane, vinyltriethoxysilane, vinyl(methyl)dimethoxysilane, vinyl(methyl)diethoxysilane, allyltrimethoxysilane, allyltriethoxysilane, allyl(methyl)dimethoxysilane, allyl(methyl)diethoxysilane, styryltrimethoxysilane, styryltriethoxysilane, styryl(methyl)dimethoxysilane, and styryl(methyl)diethoxysilane; and among them, γ-acryloyltrimethoxysilane, γ-acryloyltriethoxysilane, acryloyl(methyl)dimethoxysilane, γ-acryloyl(methyl)diethoxysilane, γ-methacryloyltrimethoxysilane, γ-methacryloyltriethoxysilane, γ-methacryloyl(methyl)dimethoxysilane, γ-methacryloyl(methyl)diethoxysilane, vinyltrimethoxysilane, vinyltriethoxysilane, vinyl(methyl)dimethoxysilane, vinyl(methyl)diethoxysilane, and the like can be included; and particularly, γ-acryloyltrimethoxysilane, γ-acryloyltriethoxysilane, γ-methacryloyltrimethoxysilane, γ-methacryloyltriethoxysilane, vinyltrimethoxysilane, vinyltriethoxysilane, and the like can be preferably used. A reason is that use of the silane compound described above can yield very dense polysiloxane excellent in heat resistance together with the balanced reactivity of the radically polymerizable group.

(3) Other Constitution

A developable polysiloxane in the present invention contains the developable group described above, but may have other functional groups as needed.

Such other functional groups include a hydrogen atom or a branched or unbranched C1-C20 substituted or unsubstituted, saturated or unsaturated hydrocarbon group; and more specifically includes an alkyl group, an alkenyl group, an alkynyl group, a substituted or unsubstituted aryl group, a substituted or unsubstituted heteroaryl group, a substituted or unsubstituted alkaryl group, a substituted or unsubstituted aralkyl group, and the like.

A monomer component capable of forming the constitutional unit having other functional groups described above is not particularly limited so far as the monomer component is a silane compound capable of forming a polysiloxane, and preferably an organosilane compound in which 2 or more alkoxy groups are bonded to the silicon atom. The type and the number of alkoxy groups can be similar to those described in section "(1) Developable Group" described above.

Specifically, an organosilane compound includes methyltrimethoxysilane, methyltriethoxysilane, methyltri(methoxyethoxy)silane, methyltri(ethoxyethoxy)silane, methyltripropoxysilane, methyltriisopropoxysilane, methyltributoxysilane, methyltri-t-butoxysilane, ethyltrimethoxysilane, ethyltriethoxysilane, hexyltrimethoxysilane, octadecyltrimethoxysilane, octadecyltriethoxysilane, 3-aminopropyltriethoxysilane, N-(2-aminoethyl)-3-aminopropyltrimethoxysilane, 3-chloropropyltrimethoxysilane, 3-(N,N-diglycidyl)aminopropyltrimethoxysilane, 3-glycidoxypropyltrimethoxysilane, γ-aminopropyltrimethoxysilane, γ-aminopropyltriethoxysilane, N-β-(aminoethyl)-γ-aminopropyltrimethoxysilane, β-cyanoethyltriethoxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltri-i-propoxysilane, γ-glycidoxypropyltributoxysilane, γ-glycidoxypropyltri(methoxyethoxy)silane, α-glycidoxybutyltrimethoxysilane, α-glycidoxybutyltriethoxysilane, β-glycidoxybutyltrimethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, 2-(3,4-epoxycyclohexyl)ethyltripropoxysilane, 2-(3,4-epoxycyclohexyl)ethyltributoxysilane, 2-(3,4-epoxycyclohexyl)ethyltrimethoxysilane, 2-(3,4-epoxycyclohexyl)ethyltriethoxysilane, 2-(3,4-epoxycyclohexyl)ethyltriphenoxysilane, 3-(3,4-epoxycyclohexyl)propyltrimethoxysilane, 3-(3,4-epoxycyclohexyl)propyltriethoxysilane, 4-(3,4-epoxycyclohexyl)butyltrimethoxysilane, 4-(3,4-epoxycyclohexyl)butyltriethoxysilane, dimethyldimethoxysilane, dimethyldiethoxysilane, γ-glycidoxypropylmethyldimethoxysilane, γ-aminopropylmethyldimethoxysilane, γ-aminopropylmethyldiethoxysilane, N-(2-aminoethyl)-3-aminopropylmethyldimethoxysilane, glycidoxymethyldimethoxysilane, α-glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylmethyldiethoxysilane, α-glycidoxypropylmethyldimethoxysilane, α-glycidoxypropylmethyldiethoxysilane, β-glycidoxypropylmethyldimethoxysilane, β-glycidoxypropylmethyldiethoxysilane, γ-glycidoxypropylmethyldimethoxysilane, γ-glycidoxypropylmethyldiethoxysilane, γ-glycidoxypropylmethyldipropoxysilane, β-glycidoxypropylmethyldibutoxysilane, γ-glycidoxypropylmethyldi(methoxyethoxy)silane, γ-glycidoxypropylethyldimethoxysilane, γ-glycidoxypropylethyldiethoxysilane, 3-chloropropylmethyldimethoxysilane, 3-chloropropylmethyldiethoxysilane, cyclohexylmethyldimethoxysilane, octadecylmethyldimethoxysilane, tetramethoxysilane, tetraethoxysilane, and the like. Two kinds or more of these compounds may be used.

In the present invention methyltrimethoxysilane, methyltriethoxysilane, phenyltrimethoxysilane, phenyltriethoxysilane, tetramethoxysilane, and tetraethoxysilane are preferred among the above described organosilane compound from view of balancing adhesion to the substrate such as ITO with hardness and developable property and easiness of synthesis of polysiloxanes.

(4) Developable Polysiloxane

The developable polysiloxane in the present invention has the constitutional unit containing the developable group described above, and when a plurality of the constitutional units is contained, identical constitutional units may be in the form of continuous blocks or a form of random distribution.

The developable polysiloxane may be used singly in one kind or in combination of two kinds or more.

The molecular weight of the developable polysiloxane described above is not particularly limited so far as the developable polysiloxane can express desired heat resistance and developable property, and preferably in the range of 500 to 200,000, and among them, more preferably in the range of 1,000 to 100,000, particularly preferably in the range of 2,000 to 50,000. A reason is that excellence in both developable property and heat resistance can be achieved.

Incidentally, the molecular weight described above is the weight average molecular weight (Mw) and the weight average molecular weight described above can be determined as a value converted from standard polystyrene samples using gel permeation chromatography (GPC).

An acid value of the developable polysiloxane described above is not particularly limited so far as the developable polysiloxane can express desired heat resistance and developable property, and preferably in the range of 30 mg KOH/g to 200 mg KOH/g, and among them, more preferably in the range of 50 mg KOH/g to 170 mg KOH/g, and particularly preferably in the range of 70 mg KOH/g to 150 mg KOH/g. A reason is that excellence in both developable property and heat resistance can be achieved.

The content of the developable polysiloxane in the present invention is not particularly limited so far as desired heat resistance and developable property can be expressed, and preferably in the range of 3% by mass to 80% by mass in the solid matter, and among them, more preferably in the range of 5% by mass to 70% by mass, and particularly preferably in the range of 10% by mass to 60% by mass. A reason is that excellence in both developable property and heat resistance can be achieved.

Incidentally, the term of "in the solid matter" means it contains all components except solvents contained in the resin composition described above.

Mass ratio (content of developable polysiloxane/content of polymerizable polysiloxane) of the developable polysiloxane described above to the polymerizable polysiloxane described above is not particularly limited so far as the developable polysiloxane can express desired heat resistance and developable property, and preferably in the range of 0.08 to 12, and among them, more preferably in the range of 0.15 to 7, and particularly preferably in the range of 0.3 to 3. A reason is that excellence in both developable property and heat resistance can be achieved.

A synthetic method of the developable polysiloxane described above is not particularly limited so far as the method is capable of synthesizing a polysiloxane containing desired constitutional units, and for example, the reaction system containing an organosilane compound under solvent-added or solvent-free condition is kept at −20° C. to 60° C., to which a mixture of water and an acid catalyst is added dropwise to proceed hydrolysis reaction. Thereinafter, the method in which temperature of the reaction system is raised to 60° C. to 150° C. to proceed dehydration and polycondensation reaction can be included.

The molecular weight and the like can be herein controlled by adjusting factors such as the amount of water and an acid catalyst, the dropwise addition rate, the type and the amount of a solvent, the temperature in hydrolysis, the reaction time and the temperature in polymerization reaction.

Incidentally, an acid catalyst includes hydrochloric acid, phosphoric acid, nitric acid, sulfuric acid, acetic acid, and the like.

The solvent also includes alcohols such as alcohol, methanol, ethanol, propanol, isopropanol, butanol, isobutanol, t-butanol, pentanol, 4-methyl-2-pentanol, 3-methyl-2-butanol, 3-methyl-3-methoxy-1-butanol, 1-t-butoxy-2-propanol, and diacetone alcohol; glycols such as ethylene glycol and propylene glycol; ethers such as ethylene glycol monomethyl ether, ethylene glycol monoethyl ether, propylene glycol monomethyl ether, propylene glycol monoethyl ether, propylene glycol monopropyl ether, propylene glycol monobutyl ether, ethylene glycol dimethyl ether, ethylene glycol diethyl ether, ethylene glycol dibutyl ether, and diethyl ether; ketones such as methyl ethyl ketone, acetylacetone, methyl propyl ketone, methyl butyl ketone, methyl isobutyl ketone, diisobutyl ketone, cyclopentanone, and 2-heptanone; amides such as dimethylformamide and dimethylacetamide; acetates such as ethyl acetate, propyl acetate, butyl acetate, isobutyl acetate, ethylene glycol monoethyl ether acetate, propylene glycol monomethyl ether acetate, 3-methoxybutyl acetate, 3-methyl-3-methoxybutyl acetate, methyl lactate, ethyl lactate, and butyl lactate; aromatic or aliphatic hydrocarbons such as toluene, xylene, hexane, and cyclohexane; γ-butyrolactone, N-methyl-2-pyridone, dimethylsulfoxide, and the like. Diacetone alcohol, propylene glycol monomethyl ether, propylene glycol monomethyl ether acetate, propylene glycol monoethyl ether, propylene glycol mono-t-butyl ether, propylene glycol monopropyl ether, propylene glycol monobutyl ether, γ-butyrolactone, and the like are preferably used from view of transmittance and crack resistance of the resin film formed using the resin composition of the present invention.

2. Polymerizable Polysiloxane

The polymerizable polysiloxane in the present invention has a radically polymerizable group and substantially no developable group.

The term of "contain substantially no developable group" means that when developed, the polymerizable polysiloxane is not removed from parts which are exposed to light and cured. Specifically, the content of the constitutional unit containing the developable group is preferably 10 mol % or less of a total constitutional unit which constitutes the polymerizable polysiloxane, and among them, more preferably 5 mol % or less, further preferably 3 mol % or less, and particularly preferably 0 mol %, that is, the polymerizable polysiloxane preferably contains no constitutional unit containing the developable group. A reason is that excellence in both developable property and heat resistance can be achieved.

Incidentally, the developable group described above, the radically polymerizable group, and a monomer component capable of forming these groups are similar to those described in section "1. Developable Polysiloxane" described above.

(1) Radically Polymerizable Group

The content of the constitutional unit containing the radically polymerizable group described above is not particularly limited so far as the polymerizable polysiloxane can express desired heat resistance and developable property, and preferably in the range of 1 mol % to 90 mol % in a total constitutional unit which constitutes the polymerizable polysiloxane, and among them, more preferably in the range of 3 mol % to 75 mol %, and particularly preferably in the range of 5 mol % to 60 mol %. A reason is that excellence in both developable property and heat resistance can be achieved.

(2) Others

The polymerizable polysiloxane in the present invention contains the radically polymerizable group described above, but may contain other functional groups as needed.

Such functional groups and a monomer component capable of forming the constitutional unit containing these groups can be similar to those described in section "1. Developable Polysiloxane" described above.

(3) Polymerizable Polysiloxane

The polymerizable polysiloxane in the present invention has the constitutional unit containing the radically polymerizable group described above, and when a plurality of the constitutional units is contained, identical constitutional units may be in the form of continuous blocks or a form of random distribution.

The polymerizable polysiloxane may be used singly in one kind or in combination of two kinds or more.

The molecular weight of the polymerizable polysiloxane described above is not particularly limited so far as the polymerizable polysiloxane can express desired heat resistance and developable property, and preferably in the range of 500 to 200,000; and among them, more preferably in the range of 1,000 to 100,000, and particularly preferably in the range of 2,000 to 50,000. A reason is that excellence in both developable property and heat resistance can be achieved.

The content of the polymerizable polysiloxane in the present invention is not particularly limited so far as the polymerizable polysiloxane can express desired heat resistance and developable property, and preferably in the range of 1% by mass to 60% by mass in the solid matter of the resin composition in the present invention; and among them, more preferably in the range of 3% by mass to 45% by mass, and particularly preferably in the range of 5% by mass to 35% by mass. A reason is that excellence in both developable property and heat resistance can be achieved.

A synthetic method of the polymerizable polysiloxane described above is not particularly limited so far as the method can synthesize the polysiloxane containing the desired constitutional units, and a similar method to the synthetic method of the developable polysiloxane described above can be used.

3. Polyfunctional Monomer

A polyfunctional monomer in the present invention may be a monomer having two or more radically polymerizable groups and cross-linkable between polyfunctional monomers themselves or with the polymerizable polysiloxane. Among them, a monomer having two or more ethylenic unsaturated double bonds is preferred, and the ethylenic unsaturated double bond includes the acryloyl group, the methacryloyl group, and the vinyl group.

Such a polyfunctional monomer specifically includes a bifunctional (meth)acrylate such as ethylene glycol di(meth)

acrylate, diethylene glycol di(meth)acrylate, hexanediol di(meth)acrylate, long chain aliphatic di(meth)acrylate, neopentyl glycol di(meth)acrylate, hydroxyl pivalic acid glycol neopentyl di(meth)acrylate, pentaerythritol di(meth)acrylate, stearic acid-modified pentaerythritol di(meth)acrylate, propylene di(meth)acrylate, glycerol di(meth)acrylate, triethylene glycol di(meth)acrylate, tetraethylene glycol di(meth)acrylate, tetramethylene glycol di(meth)acrylate, butylene glycol di(meth)acrylate, dicyclopentanyl di(meth)acrylate, polyethylene glycol di(meth)acrylate, polypropylene di(meth)acrylate, triglycerol di(meth)acrylate, neopentyl glycol-modified trimethylolpropane (di)meth)acrylate, allylated cyclohexyl di(meth)acrylate, methoxylated cyclohexyl di(meth)acrylate, acryloylated isocyanurate, bis(acryloxyneopentyl glycol) adipate, bisphenol A di(meth)acrylate, tetrabromobisphenol A di(meth)acrylate, bisphenol S di(meth)acrylate, butanediol di(meth)acrylate, phthalic acid di(meth)acrylate, and zinc di(meth)acrylate.

A polyfunctional (meth)acrylate includes a (meth)acrylate having three or more functional groups such as trimethylolpropane tri(meth)acrylate, trimethylolethane tri(meth)acrylate, glycerol tri(meth)acrylate, pentaerythritol tri(meth)acrylate, alkyl-modified dipentaerythritol tri(meth)acrylate, tris(acryloxyethyl) isocyanurate, tris(methacryloxyethyl) isocyanurate, pentaerythritol tetra(meth)acrylate, dipentaerythritol tetra(meth)acrylate, ditrimethylolpropane tetra(meth)acrylate, alkyl-modified dipentaerythritol tetra(meth)acrylate, dipentaerythritol monohydroxy penta(meth)acrylate, dipentaerythritol hexa(meth)acrylate, alkyl-modified dipentaerythritol penta(meth)acrylate, urethane tri(meth)acrylate, ester tri(meth)acrylate, urethane hexa(meth)acrylate, ester hexa(meth)acrylate, and succinic acid-modified dipentaerythritol penta(meth)acrylate.

A compound having the triazine ring skeleton such as tris(2-acryloyloxyethyl) isocyanurate, di(2-acryloyloxyethyl)monohydroxyethyl isocyanurate, triallyl isocyanurate, trivinyl isocyanurate, trimethallyl isocyanurate, and trigylcidyl isocyanurate can also be used.

Among them, a compound having the triazine ring skeleton is preferably used in the present invention; particularly, tris(2-acryloyloxyethyl) isocyanurate, di(2-acryloyloxyethyl)monohydroxyethyl isocyanurate, triallyl isocyanurate, trivinyl isocyanurate, trimethallyl isocyanurate, and trigylcidyl isocyanurate can be preferably used; and among them, tris(2-acryloyloxyethyl) isocyanurate, triallyl isocyanurate, trivinyl isocyanurate, and trimethallyl isocyanurate can be preferably used. A reason is that excellent adhesion and resistance to yellowing after heating at high temperature can be obtained by including the compound described above. Particularly, a reason is that a resin film excellent in adhesion and resistance to yellowing can be formed even after performing a heat treatment step at high temperature of 250° C. or above.

These polyfunctional monomers may be used singly in one kind or in combination of two kinds or more.

The content of the polyfunctional monomer described above is not particularly limited so far as desired heat resistance of the resin film can be obtained, and preferably in the range of 10% by mass to 80% by mass in the solid matter, and among them, more preferably in the range of 20% by mass to 70% by mass, and particularly preferably in the range of 30% by mass to 60% by mass. A reason is that excellence in both developable property and heat resistance can be achieved.

4. Resin Composition

The resin composition of the present invention contains at least a developable polysiloxane, a polymerizable polysiloxane, and a polyfunctional monomer, and a polymerization initiator, a solvent, an additive, a binder resin, and the like can be contained as needed.

(1) Polymerization Initiator

The polymerization initiator described above is not particularly limited so far as the polyfunctional monomer and the polymerizable polysiloxane described above can be polymerized as well as both can be polymerized to each other, and a common polymerization initiator can be used.

Specifically a photopolymerization initiator includes an aromatic ketone such as benzophenone, Michler's ketone, 4,4'-bis(diethylamino)benzophenone, 4-methoxy-4'-dimethylaminobenzophenone, 2-ethylanthraquinone, and phenanthrene; a benzoin ether such as benzoin methyl ether, benzoin ethyl ether, and benzoin phenyl ether; a benzoin derivative such as methylbenzoin and ethylbenzoin; 2-(o-chlorophenyl)-4,5-phenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2,4,5-triallylimidazole dimer, 2-(o-chlorophenyl)-4,5-di(m-methylphenyl)imidazole dimer, 2-benzyl-2-dimethylamino-1-(4-morpholinophenyl)butanone; a halomethylthiazole compound such as 2-trichloromethyl-5-styryl-1,3,4-oxadiazole, 2-trichloromethyl-5-(p-cyanostyryl)-1,3,4-oxadiazole, and 2-trichloromethyl-5-(p-methoxystyryl)-1,3,4-oxadiazole; a halomethyl-s-triazine type compound such as 2,4-bis(trichloromethyl)-6-p-methoxystyryl-s-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphtho-1-yl)-4,6-bis(trichloromethyl)-s-triazine, 2-(4-ethoxynaphtho-1-yl)-4,6-bis(trichloromethyl)-s-triazine, and 2-(4-butoxynaphtho-1-yl)-4,6-bis(trichloromethyl)-s-triazine; 2,2-dimethoxy-1,2-diphenylethane-1-one, 2-methyl-1-[4-(methylthio(phenyl)]-2-morpholinoproanone-1-one, 1,2-benzyl-2-dimethylamino-1-(4-moropholinophenyl)butanone-1, benzyl, benzoyl benzoic acid, methyl benzoylbenzoate, 4-benzoyl-4'-methyldiphenyl sulfide, benzyl methyl ketal, dimethylaminobenzoate, isoamyl p-dimethylaminobenzoate, 2-n-butoxyethyl-4-dimethylaminobenzoate, 2-chlorothioxanthone, 2,4-diethylthioxanthone, 2,4-dimethylthioxanthone, isopropylthioxanthone, ethanone, 1-[9-ethyl-6-(2-methylbenzoyl)-9H-carbazole-3-yl]-1-(o-acetyloxime), 4-benzoylmethyldiphenyl sulfide, 1-hydroxycyclohexyl phenyl ketone, 2-benzyl-2-(dimethylamino)-1-[4-(4-morpholinyl)phenyl]-1-butanone, 2-(dimethylamino)-2-[(4-methylphenyl)methyl]-1-[4-(4-morpholinyl)phenyl]-1-butanone, α-dimethoxy-α-phenylacetophenone, phenylbis(2,4,6-trimethylbenzoyl)phosphine oxide, 2-methyl-1-[4-(methylthio)phenyl]-2-(4-morpholinyl)-1-propanone, and 1,2-octadione. Further, 2-hydroxy-1-{4-[4-(2-hydroxy-2-methylpropionyl)benzyl]phenyl}-2-methylpropane-1-one, 2-hydroxy-4'-hydroxyethoxy-2-methylpropiophenone, oligo{2-hydroxy-2-methyl-1-[4-(1-methylvinyl)phenyl] propanone}, 2,4,6-trimethylbenzoyldiphenylphosphine oxide, and the like can also be used.

Among them, oligo{2-hydroxy-2-methyl-1-[4-(1-methylvinyl)phenyl]propanone}, 2-methyl-1-[4-(methylthio)phenyl]-2-morpholinopropanone-1-one, 1-hydroxycyclohexyl phenyl ketone, and the like are particularly preferred in the present invention from view of preventing yellowing after heating at high temperature.

These photopolymerization initiators may be used singly in one kind or in combination of two kinds or more in the present invention.

The content of such a polymerization initiator may be selected such that the resin composition described above can be cured at the desired curing rate, and preferably in the range of 0.1% by mass to 20% by mass in the solid matter, and among them, more preferably in the range of 0.7% by mass to 10% by mass.

(2) Solvent

A solvent used in the present invention is not particularly limited so far as the solvent is an organic solvent which does not react with each component in the resin composition described above and can dissolve or disperse these compositions.

A solvent specifically includes alcohols such as methanol and ethanol; ethers such as tetrahydrofuran; glycol ethers such as ethylene glycol monomethyl ether, ethylene glycol dimethyl ether, ethylene glycol methyl ethyl ether, and ethylene glycol monoethyl ether; ethylene glycol alkyl ether acetates such as methyl cellosolve acetate and ethyl cellosolve acetate; diethylene glycols such as diethylene glycol monomethyl ether, diethylene glycol diethyl ether, diethylene glycol dimethyl ether, diethylene glycol ethyl methyl ether, diethylene glycol monoethyl ether, and diethylene glycol monobutyl ether; propylene glycol alkyl ether acetates such as propylene glycol methyl ether acetate, and propylene glycol ethyl ether acetate; aromatic hydrocarbons such as toluene and xylene; ketones such as methyl ethyl ketone, methyl amyl ketone, cyclohexanone, and 4-hydroxy-4-methyl-2-pentanone; and esters such as ethyl 2-hydroxy-2-methylpropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanoate, methyl 3-methoxypropionate, ethyl 3-methoxypropionate, methyl 3-ethoxypropionate, ethyl 3-ethoxypropionate, ethyl acetate, butyl acetate, methyl lactate, ethyl lactate, 3-methoxybutyl acetate, and 3-methyl-3-methoxybutyl acetate.

Among them, propylene glycol alkyl ether acetates, glycol ethers, and ketones are preferred in the present invention from view of film flatness in a film forming step and solubility of each component contained, and among them, propylene glycol methyl ether acetate (hereinafter, written as PEGMEA in some cases), propylene glycol methyl ether, 4-hydroxy-4-methyl-2-pentanone, and the like are particularly preferred.

These solvents may also be used singly or in combination of two or more kinds.

The content of a solvent used in the present invention in the resin composition described above is preferably in the range of 60% by mass to 95% by mass, and more preferably in the range of 70% by mass to 90% by mass. A reason is that such a range of the content can make the viscosity suitable for coating.

(3) Additive

An additive in the present invention is not particularly limited so far as heat resistance of the resin film formed using the resin composition of the present invention is not decreased.

Specifically a pigment, light shielding fine particles, a polymerization inhibitor, a chain transfer agent, a leveling agent, a plasticizer, a surfactant, an antifoaming agent, an adhesion promoting agent, a refractive index enhancement agent, a phosphate compound, and the like can be included.

(a) Refractive Index Enhancement Agent

A reason that a refractive index enhancement agent is added is that for example, when the resin film described above is stacked on the transparent electrode formed using the transparent electrode material such as ITO, the pattern of the transparent electrode described above can be made invisible by containing the refractive index enhancement agent described above. Therefore, a reason is that when the resin composition of the present invention is used in an optical instrument such as a touch panel in which light transmittance is required, use of the refractive index enhancement agent can prevent the transparent electrode contained in the sensor electrode from being seen through from the side of the screen to be touched, thereby giving the touch panel excellent in design and visibility.

The refractive index enhancement agent described above is not particularly limited so far as the refractive index of the resin film described above becomes higher, and includes fine particles such as fine particles of metals, and fine particles of metal oxides, and among them, preferably fine particles of metal oxides. A reason is that the resin film can be electrically insulated.

Fine particles of metal oxides preferably contain at least one type of elements selected from the group consisting of titanium, zinc, zirconium, antimony, indium, tin, silicon, and aluminum. The metal oxide specifically includes antimony pentoxide, titanium oxide, zinc oxide, zirconium oxide, silicon oxide, antimony-doped tin oxide (ATO), tin-doped indium oxide (ITO), fluorine-doped tin oxide (FTC)), phosphorous-doped tin oxide (PTO), zinc antimonate (AZO), indium-doped zinc oxide (IZO), tin oxide, ATO-covered titanium oxide, aluminum-doped zinc oxide, gallium-doped zinc oxide, and the like. These compounds are readily available from publicly known commercial products. Fine particles of metals can be exemplified by the metal selected from the group consisting of titanium, zinc, zirconium, antimony, indium, tin, silicon, and aluminum. These fine particles may be used singly or in combination of two or more kinds.

The average primary particle size of fine particles used in the present invention is not particularly limited so far as desired refractive index enhancement can be obtained, and can be, for example, in the range of 5 nm to 200 nm, and among them, preferably in the range of 5 nm to 100 nm, and particularly preferably in the range of 10 nm to 50 nm.

A reason is that when the average primary particle size is below 5 nm, a cohesive force between fine particles is very high, making it very difficult for fine particles to disperse into the size of the primary particle with high transparency. On the one hand, a reason is that in the case of metal oxides in which the average primary particle size exceeds 200 nm, metal oxides are readily dispersed to the primary particle size, but a larger size of particles is likely to cause scattering of light such as visible light, causing a problem of which transparency of the resin film is deteriorated.

Incidentally, the average primary particle size can be determined, for example, by direct observation of fine particles themselves using a transmission electron microscope (TEM) or a scanning electron microscope (SEM) or by use of the dynamic light scattering method.

The content of fine particles is not particularly limited so far as a desired refractive index of the resin film can be obtained. Specifically, the PV ratio which is the mass ratio between fine particles and the total resin component is preferably in the range of 0.3 to 1.8. The lower limit is preferably 0.6 or more and the upper limit is preferably 1.5 or less, and more preferably 1.2 or less. A reason is that this range can increase the refractive index of the resin film approaching to the refractive index of the transparent electrode such as ITO, while keeping transparency high. Another reason is also that when the PV ratio is below 0.3, even addition of fine particles cannot sufficiently increase the refractive index of the resin film after cured. A reason is also that the developable property is decreased. On the one hand, a reason is that when the PV ratio exceeds 1.8, the haze value is increased to decrease transparency.

Incidentally, a total resin component corresponds to the amount of the material in which a total mass of fine particles is subtracted from the amount of the solid matter in the present invention.

(b) Phosphate Compound

A phosphate compound can be contained for improving adhesion of the resin film to the transparent electrode material such as ITO.

Such a phosphate compound is not particularly limited so far as adhesion of the resin film to the transparent electrode and the like can be improved, and the phosphate compound having an ethylenic unsaturated double bond in the molecule is preferred. Specifically, (meth)acrylate phosphates such as 2-methacryloyloxyethyl acid phosphate (trade names: Light Ester P-1M and Light Ester P-2M, from Kyoeisha Chemical Co., Ltd.), ethylene oxide-modified phosphoric acid dimethacrylate phosphate (trade name: PM-21 from Nippon Kayaku Co., Ltd.), and phosphoric acid-containing epoxy methacrylate (trade name: New Frontier S-23A from Daiichi Kogyo Seiyaku Co., Ltd.) and a phosphate compound having a vinyl group such as vinylphosphonic acid (trade names: VPA-90 and VPA-100 from BASF Corporation) can be included.

The content of the phosphate compound described above is not particularly limited so far as desired adhesion is achieved, and preferably in the range of 0.1% by mass to 30% by mass, and among them, more preferably in the range of 1% by mass to 20% by mass, particularly preferably in the range of 3% by mass to 15% by mass in the solid matter. A reason is that the content described above can give the resin film excellent adhesion.

(c) Adhesion Promoting Agent

The adhesion promoting agent described above is not particularly limited so far as adhesion of the resin film to the transparent electrode material such as ITO and to glass and the like can be improved, and when an object to form the resin film is the transparent electrode, the glass substrate, and the like, a silane coupling agent, for example, of KBM-403™, KBM-503™, and KBM-803™ from Shin-etsu Chemical Co., Ltd. can be blended in the proportion of 0.1% by mass to 10% by ™ mass to the total solid matter.

(d) Surfactant

As the surfactant described above, for example, a fluorine type surfactant of Megaface R08MH™, RS-72-K™, RS-75™, and the like from DIC Corporation, and a silicone type surfactant of BYK-333™ and BYK-301™, and the like from BYK-Chemie Japan K. K. can be blended in the proportion of 0.1% by mass to 5% by mass to the total solid matter.

(4) Resin Composition

A method of forming the resin composition in the present invention is not particularly limited so far as each component described above can be uniformly dispersed, and a publicly known method for mixing and dispersion can be used.

Use of the resin composition in the present invention is not particularly limited so far as hardness and heat resistance are required in its application, and includes, for example, a protective layer and an insulation layer contained in a display device such as a touch panel, a solar battery, and a liquid crystal display device, pixel portions of a color filter, an LED lighting device, and the like, and among them, the resin composition is preferably used in formation of the member of which heat resistance is required.

B. Transparent Membrane for a Touch Panel

Next, a transparent membrane for a touch panel will be described.

A transparent membrane for a touch panel in the present invention is characterized in that the transparent membrane for a touch panel is formed using a resin composition, and the resin composition has a developable polysiloxane containing the developable functional group and substantially no radically polymerizable group, a polymerizable polysiloxane containing the radically polymerizable group and substantially no developable functional group, and a polyfunctional monomer.

Figure 2:
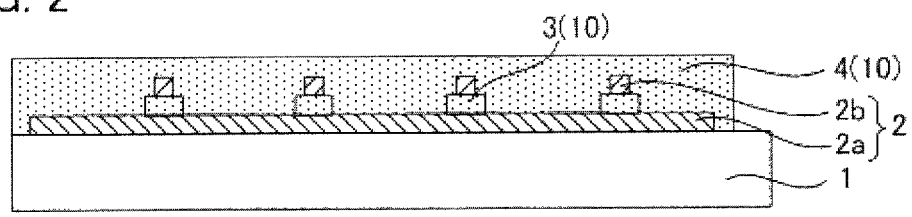
FIG. 2 is a cross-sectional view taken along line A-A in FIG. 1.
Figure 3:
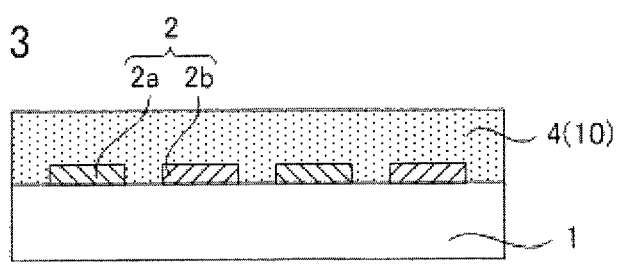
FIG. 3 is a cross-sectional view taken along line B-B in FIG. 1.

Such a transparent membrane for a touch panel in the present invention will be described with reference to a figure. FIG. 1 is a schematic plan view of illustrating an example of a touch panel in which the transparent membrane for a touch panel in the present invention is used. FIG. 2 is a cross-sectional view taken along line A-A in FIG. 1 and FIG. 3 is a cross-sectional view taken along line B-B in FIG. 1. As exemplified in FIG. 1 to FIG. 3, the touch panel 20 in which the transparent membrane 10 for a touch panel of the present invention is used has the transparent substrate 1, the sensor electrode 2 containing the first electrode 2a formed on one side surface of the transparent substrate 1 described above and the second electrode 2b insulated from the first electrode 2a described above, the inter-electrode insulation layer 3 formed between the first electrode 2a and the second electrode 2b described above, and the overcoat layer 4 formed so as to cover the first electrode 2a and the second electrode 2b described above.

In this example, the transparent membrane 10 for the touch panel described above is used as the inter-electrode insulation layer 3 and the overcoat layer 4 described above. The routing wire 6 is also connected to the sensor electrode 2, forming an external connection terminal at the end of the routing wire 6.

Incidentally, in FIG. 1, the inter-electrode insulation layer 3 and the overcoat layer 4 described above are omitted for simplifying description.

According to the present invention, since the transparent membrane for a touch panel is formed using the resin composition described above, the transparent membrane is excellent in adhesion and little yellowed after heat treatment at high temperature of 250° C. or above.

In the past, different materials are used for formation of each member which requires different properties such that heat resistance is required for the inter-electrode insulation layer used between sensor electrodes and hardness is required for the overcoat layer. By contrast, since both hardness and heat resistance are excellent in the transparent membrane for a touch panel described above, commonalization of materials for forming the inter-electrode insulation layer and the overcoat layer described above can be achieved. Process simplification and cost reduction can therefore be achieved.

The transparent membrane for a touch panel in the present invention is formed using the resin composition described above.

Hereinafter, each constitution of the transparent membrane for a touch panel in the present invention will be described.

Incidentally, since the resin composition described above is similar to that described in section "A. Resin Composition" described above, its description is herein omitted.

Use of the transparent membrane for a touch panel in the present invention is not particularly limited so far as use is in the area in which desired transparency is required, and includes the inter-electrode insulation layer formed between the first electrode and the second electrode constituting the sensor electrode, the overcoat layer formed so as to cover the sensor electrode, and the like. Among them, the transparent membrane for a touch panel is preferably used for the inter-electrode insulation layer, particularly preferably both the inter-electrode insulation layer and the overcoat layer. A reason is that little deterioration of the protective layer for electrodes occurs, even when the electrode formed so as to cover the inter-layer insulation layer is the transparent electrode and the heat treatment process is performed at high temperature when forming the transparent electrode.

Another reason is also that since the resin film formed with the resin composition described above is excellent in hardness, its use for the overcoat layer can give a touch panel with excellent scratch resistance. A reason is also that commonalization of materials for both the inter-electrode insulation layer and the overcoat layer can be achieved and process simplification and cost reduction can be achieved, since different properties required for both members can be simultaneously satisfied.

Incidentally, a temperature condition in the heat treatment process at high temperature may be a temperature in which conductivity of the transparent electrode can be improved, and indicates the temperature, for example, in the range of 235° C. to 350° C., and among them, preferably the temperature in the range of 240° C. to 330° C., and particularly preferably in the range of 250° C. to 300° C. A reason is that the temperature condition described above can further effectively express the effects of the present invention.

Transmittance of the transparent membrane for a touch panel described above in the visible light region is not particularly limited so far as excellent visibility of the touch panel can be obtained, and may be appropriately set depending on factors such as use of the transparent membrane for a touch panel described above.

In the present invention, transmittance is preferably 80% or more, and more preferably 90% or more. A reason is that selection of the transmittance described above to the range described above can form a touch panel excellent in visibility.

The transmittance described above herein denotes the Y value among the tristimulus values X, Y, and Z of the body color through transmission determined by the formula defined by JIS-Z 8701 (Color specification method-XYZ color display system and X10Y10Z10 color display system) using the standard light source C (JIS Z 8720, Standard illuminants (standard light) and standard light sources for colorimetry). As such a method of measuring transmittance, for example, JIS K 7361-1 (Plastics-test method of the total luminous transmittance of transparent materials) can be used. More specifically, a spectrophotometer Model OSP-SP2000™ from Olympus Corporation can be used.

The transparent membrane for a touch panel described above preferably contains a refractive index enhancement agent. A reason is that when the transparent membrane for a touch panel is disposed adjacent to the sensor electrode, the sensor electrode is prevented from being seen from the side of the screen to be touched, thereby making the touch panel excellent in visibility.

The refractive index of the transparent membrane for a touch panel described above is not particularly limited so far as desired refractive index can be obtained, and preferably in the range of 1.55 to 1.90, and among them, more preferably in the range of 1.57 to 1.80, and particularly preferably in the range of 1.60 to 1.75. A reason is that adjusting the refractive index to the range described above can prevent the sensor electrode from making visible from the side of the screen to be touched.

Incidentally, since such a refractive index enhancement agent is similar to the agent described in section "A. Resin Composition", its description is herein omitted.

Thickness of the transparent membrane for a touch panel described above is not particularly limited so far as desired hardness and heat resistance can be expressed, and appropriately selected in accordance with factors such as use of the transparent membrane for a touch panel and the like.

For example, when used as the overcoat layer described above, thickness is preferably in the range of 0.5 µm to 5 µm, and among them, more preferably in the range of 1 µm to 3 µm. A reason is that little scratching and peeling occurs in each constitution contained in the touch panel described above.

Also, when used as the inter-electrode insulation layer described above, thickness is preferably in the range of 0.5 µm to 10 µm, and among them, more preferably in the range of 1 µm to 5 µm. A reason is that short circuit between electrodes can be consistently prevented.

A method of forming the transparent membrane for a touch panel is not particularly limited so far as the method uses the resin composition described above to form a desired pattern on the transparent membrane for a touch panel described above, and a general method can be used. Specifically, a method of applying the resin composition described above to the substrate, followed by drying to form a coated film and then expose the coated film described above to light through a mask to develop a pattern can be used.

C. Touch Panel

Next, a touch panel of the present invention will be described.

A touch panel of the present invention is a touch panel comprising a transparent substrate and a sensor electrode formed on the transparent substrate described above, characterized in that the touch panel has the transparent membrane for a touch panel formed using a resin composition, and the resin composition has the developable polysiloxane containing the developable group and substantially no radically polymerizable group, the polymerizable polysiloxane containing the radically polymerizable group and substantially no developable group, and a polyfunctional monomer.

Such a touch panel specifically includes touch panels illustrated in FIGS. 1 and 2 which were already described.

According to the present invention, since the touch panel has the transparent membrane for a touch panel which is formed using the resin composition described above, members formed using such a transparent membrane for a touch panel can have excellent heat resistance.

The touch panel of the present invention has the transparent substrate described above, the sensor electrode, and the transparent membrane for a touch panel.

Hereinafter, each constitution of the touch panel of the present invention will be described in detail.

Since the transparent member for a touch panel described above is similar to the transparent membrane described in section "B. Transparent Membrane for a Touch Panel" described above, its description is herein omitted.

1. Transparent Substrate

As the transparent substrate in the present invention, materials generally used for a touch panel can be similarly used. Specifically, materials may include an inorganic material such as glass and a resin material such as a polyester type resin such as polyethylene terephthalate (PET) and the like, acrylic resins, and polycarbonate.

Thickness of the transparent substrate is preferably a thickness which is thin enough to form a flexible film, and when the insulation substrate described above is formed with a resin material, thickness is specifically preferably in the range of 50 μm to 300 μm.

2. Sensor Electrode

A sensor electrode in the present invention is formed on the transparent substrate described above, and generally contains the first electrode and the second electrode which is insulated from the first electrode described above.

The arrangement of the first electrode and the second electrode described above is not particularly limited so far as the touching operation can be detected. For example, the aspect can include: an aspect in which, as illustrated in FIG. 1 to FIG. 3 or FIG. 4 which were already described, both the first electrode and the second electrode are formed on one surface side of the transparent substrate and the inter-electrode insulation layer is formed between both electrodes; and an aspect in which, as exemplified in FIG. 5, the first electrode and the second electrode are separately formed on one surface side and other surface side of the transparent substrate. In the present invention, among them, an aspect in which the inter-electrode insulation layer is formed between the first electrode and the second electrode is preferred. A reason is that little deterioration of the inter-electrode insulation layer occurs by using the transparent membrane for a touch panel described above as the inter-electrode insulation layer described above, even when a transparent electrode is used as an electrode on the inter-electrode insulation layer described above and a heat treatment process at high temperature is performed when forming the transparent electrode. Therefore, a reason is that the effects of the present invention can be further effectively expressed.

Figure 4:
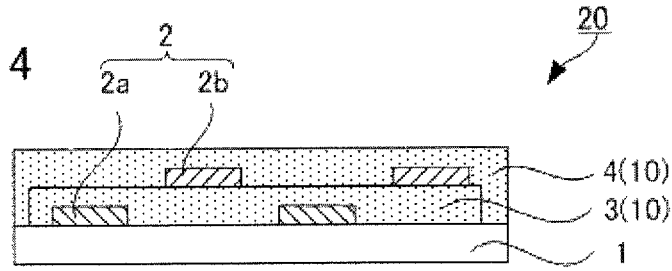
FIG. 4 is a descriptive view of describing a sensor electrode in the present invention.
Figure 5:
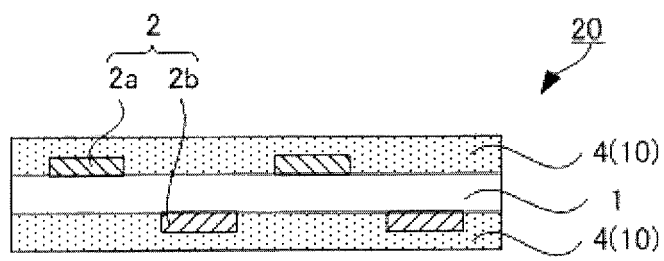
FIG. 5 is a descriptive view of describing a sensor electrode in the present invention.

Incidentally, FIG. 1 to FIG. 3 which were already described illustrate an example of forming the inter-electrode insulation layer so as to cover parts of the first electrode, that is, an example of forming the inter-electrode insulation layer at the place where the first electrode is overlapped with the second electrode in a plan view. FIG. 4 also illustrates an example of forming the inter-electrode insulation layer so as to cover a whole first electrode. Since reference signs in FIG. 4 and FIG. 5 indicate the same members in FIG. 1 to FIG. 3, their description is herein omitted.

The first electrode and the second electrode described above can be an electrode having desired conductivity, can be a transparent electrode formed using a transparent electrode material having transparency, or can be a light shielding electrode formed using a light shielding electrode material having a light shielding property.

In the present invention, among them, when the inter-electrode insulation layer is formed between the first electrode and the second electrode described above, the electrode formed so as to cover the inter-electrode insulation layer described above, that is, the electrode formed after formation of the inter-electrode insulation layer described above is preferably a transparent electrode. A reason is that effects of forming the inter-electrode insulation layer described above using the transparent membrane for a touch panel described above can be expressed more effectively.

A transparent electrode material described above specifically includes indium tin oxide (ITO), zinc oxide, indium oxide, antimony-doped tin oxide, fluorine-doped tin oxide, aluminum-doped zinc oxide, potassium-doped zinc oxide, silicon-doped zinc oxide, metal oxides of zinc oxide-tin oxide type, indium oxide-tin oxide type, zinc oxide-indium oxide-magnesium oxide type, and the like, and a material of which two or more types of these metal oxides form a metal oxide complex.

As a light shielding material, for example, the material described in JP-A No. 2010-238052 can also be used. Specifically, a metal such as aluminum, molybdenum, silver, and chromium, and their alloys and the like can be used. A material commonly used in a touch panel can be used.

A pattern in the first electrode and the second electrode described above in a plan view and their thickness can be similar to those commonly used in a touch panel. Specifically, the pattern can be a pattern described in JP-A No. 2011-210176 and JP-A No. 2010-238052.

3. Touch Panel

A touch panel of the present invention has the transparent substrate, the sensor electrode, and the transparent membrane for a touch panel described above, and may have other constitution as needed.

Other type of constitution is a constitution generalized in a touch panel, and includes, for example, a routing wire connected to the sensor electrode described above, and an external connection terminal connected to the sensor electrode with the routing wire.

Figure 6A:
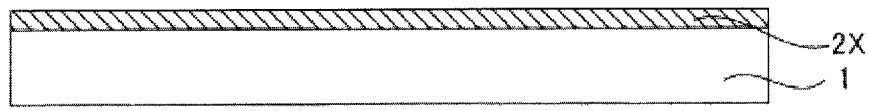
FIGS. 6A to 6G is a flow chart of illustrating a manufacture method of a touch panel in the present invention.
Figure 6B:
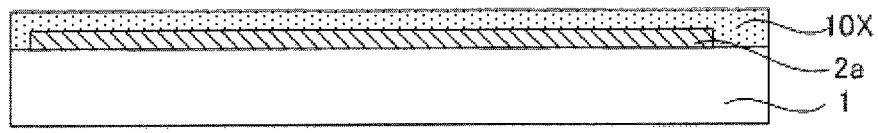
Figure 6C:
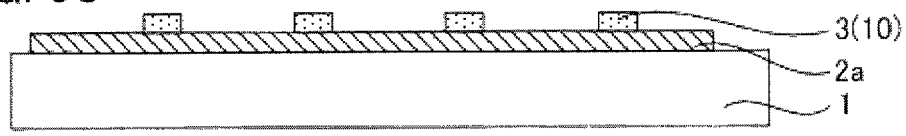
Figure 6D:
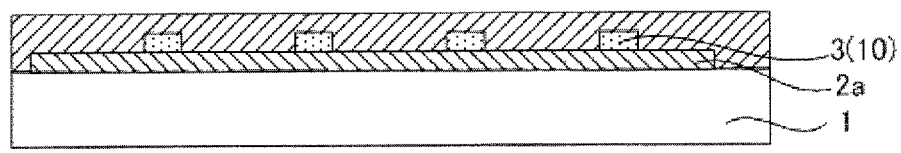
Figure 6E:
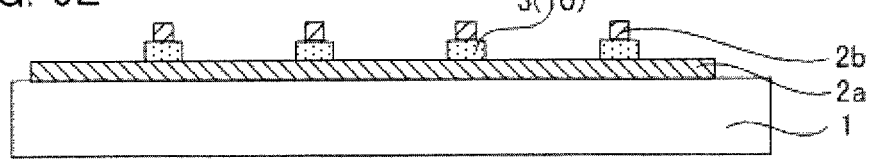
Figure 6F:
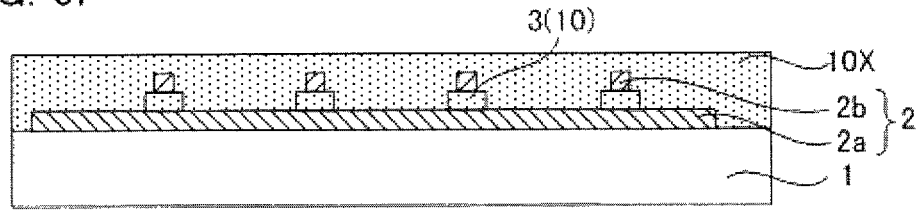
Figure 6G:
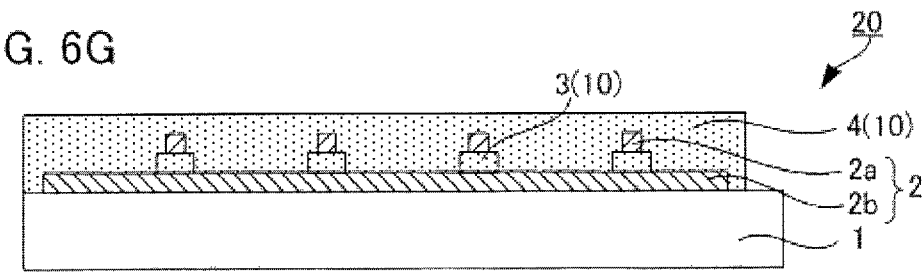

A manufacture method of a touch panel in the present invention is not particularly limited so far as the method can form each constitution with high accuracy, and as exemplified in FIGS. 6A to 6G, includes a method of, for example, forming the transparent electrode material layer 2X on the transparent substrate 1 using ITO (FIG. 6A), forming the resist pattern on the transparent electrode material layer 2X, which is etched using the resist described above as a mask and heat-treated to form the first electrode 2a. Next, the resin composition layer 10X is formed (FIG. 6O) using the resin composition described above, and exposed to light through the pattern, followed by development to form the inter-electrode insulation layer 3 in the mask pattern (FIG. 6C). Thereinafter, the transparent electrode material layer 2X is formed (FIG. 6D), etched using the resist as a mask, and heat-treated to form the second electrode 2b (FIG. 6E). Thereinafter, the resin composition layer 10X (FIG. 6F) is formed using the resin composition described above so as to cover the sensor electrode 2 containing the first electrode 2a and the second electrode 2b, the resultant is exposed to light through the pattern, then developed to form the overcoat layer 4 in the mask pattern. Thereby, the touch panel 20 of which the inter-electrode insulation layer 3 and the overcoat layer 4 are the transparent membrane 10 for the touch panel described above is yielded (FIG. 6G).

Incidentally, the present invention is not limited to the embodiment described above. The embodiment described above only illustrates an example, and any and all features having substantially same constitution as the technical idea described in the claim of the present invention and providing similar operation and working effects are included within the technical scope of the present invention.

EXAMPLES

Hereinafter, examples are illustrated to further specifically describe the present invention.

Synthesis Example 1

A mixed solution of 10.8 g of ion-exchanged water and 0.08 g of phosphoric acid was added dropwise to a mixed solution of 16.3 g of trimethoxy(methyl)silane, 11.5 g of trimethoxyphenylsilane, 5.15 of γ-acryloylpropyltrimethoxysilane, and 50.0 g of 4-hydroxy-4-methyl-2-penanone. The mixture was stirred at a liquid temperature of 40° C. for 1 hour and then the liquid temperature was raised to 60° C. to stir for 1 hour. Thereinafter, the liquid temperature was raised to 100° C. over 30 minutes to further stir the mixture for 120 minutes while distilling off methanol and water formed in the reaction. Further added to the solution obtained was 4-hydroxy-4-methyl-2-pentanone to adjust the concentration of siloxane to 40% by weight yielding a polysiloxane solution (i). The weight average molecular weight of the polysiloxane obtained was 7,500.

Synthesis Example 2

A mixed solution of 10.8 g of ion-exchanged water and 0.08 g of phosphoric acid was added dropwise to a mixed solution of 15.0 g of trimethoxy(methyl)silane, 7.9 g of trimethoxyphenylsilane, 11.7 g of γ-acryloylpropyltrimethoxysilane, and 50.0 g of 4-hydroxy-4-methyl-2-pentanone. The mixture was stirred at a liquid temperature of 40° C. for 1 hour and then the liquid temperature was raised to 60° C. to stir for 1 hour. Thereinafter, the liquid temperature was raised to 100° C. over 30 minutes to further stir the mixture for 120 minutes while distilling off methanol and water formed in the reaction. Added to the solution obtained was 4-hydroxy-4-methyl-2-pentanone to adjust the concentration of siloxane to 40% by weight yielding a polysiloxane solution (ii). The weight average molecular weight of the polysiloxane obtained was 7,000.

Synthesis Example 3

A mixed solution of 10.8 g of ion-exchanged water and 0.08 g of phosphoric acid was added dropwise to a mixed solution of 16.3 g of trimethoxy(methyl)silane, 11.5 g of trimethoxyphenylsilane, 5.8 g of 3-trimethoxysilylpropyl succinate, and 50.0 g of 4-hydroxy-4-methyl-2-pentanone. The mixture was stirred at a liquid temperature of 40° C. for 1 hour and then the liquid temperature was raised to 60° C. to stir for 1 hour. Thereinafter, the liquid temperature was raised to 100° C. over 30 minutes to further stir the mixture for 120 minutes while distilling off methanol and water formed in the reaction. Added to the solution obtained was 4-hydroxy-4-methyl-2-pentanone to adjust the concentration of siloxane to 40% by weight yielding a polysiloxane solution (iii). The weight average molecular weight of the polysiloxane obtained was 6,500. The acid value was 100 mg KOH/g.

Synthesis Example 4

A mixed solution of 10.8 g of ion-exchanged water and 0.08 g of phosphoric acid was added dropwise to a mixed solution of 25.4 g of trimethoxy(methyl)silane, 3.6 g of 3-trimethoxysilylpropyl succinate, and 50.0 g of 4-hydroxy-4-methyl-2-pentanone. The mixture was stirred at a liquid temperature of 40° C. for 1 hour and then the liquid temperature was raised to 60° C. to stir for 1 hour. Thereinafter, the liquid temperature was raised to 100° C. over 30 minutes to further stir the mixture for 120 minutes while distilling off methanol and water formed in the reaction. Added to the solution obtained was 4-hydroxy-4-methyl-2-pentanone to adjust the concentration of siloxane to 40% by weight yielding a polysiloxane solution (iv). The weight average molecular weight of the polysiloxane obtained was 8,500. The acid value was 100 mg KOH/g.

Synthesis Example 5

A mixed solution of 14.0 g of ion-exchanged water and 0.022 g of phosphoric acid was added dropwise to a mixed solution of 10.2 g of trimethoxy(methyl)silane, 19.8 g of trimethoxyphenylsilane, 18.5 g of 2-(3,4-epoxycyclonexyl) ethyltrimethoxysilane, and 50.0 g of 4-hydroxy-4-methyl-2-pentanone. The mixture was stirred at a liquid temperature of 40° C. for 1 hour and then the liquid temperature was raised to 60° C. to stir for 1 hour. Thereinafter, the liquid temperature was raised to 100° C. over 30 minutes to further stir the mixture for 120 minutes while distilling off methanol and water formed in the reaction. Added to the solution obtained was 4-hydroxy-4-methyl-2-pentanoneto adjust the concentration of siloxane to 40% by weight yielding a polysiloxane solution (v). The weight average molecular weight of the polysiloxane obtained was 7,000.

Comparative Synthesis Example 1

A polysiloxane solution (vi) was obtained similarly to Synthesis Example 1 except 10.9 g of trimethoxy(methyl) silane, 5.6 g of trimethoxyphenylsilane, 5.8 g of 3-trimethoxysilylpropyl succinate, and 16.4 g of γ-acryloylpropyltrimethoxysilane were used as an organoalkoxy silane. The weight average molecular weight of polysiloxane obtained was 7,500. The acid values was 100 mg KOH/g.

Comparative Synthesis Example 2

A mixed solution of 30 parts by weight of benzyl methacrylate, 38 parts by weight of methyl methacrylate, 18 parts by weight of methacrylic acid, and t-butylperoxy-2-ethylhexanoate (trade name: Perbutyl O from NOF Corporation) was added dropwise to 150 parts by weight of propylene glycol monomethyl ether acetate charged into a polymerization vessel under a stream of nitrogen at 100° C. over 3 hours. After dropwise addition was completed, the mixture was further heated at 100° C. for 3 hours yielding a polymer solution. The weight average molecular weight of this polymer solution is 8,000. Next, to the polymer solution obtained were added 14 parts by weight of glycidyl methacrylate, 0.2 part by weight of triethylamine, and 0.05 part by weight of p-methoxyphenol to heat at 110° C. for 10 hours to react the carboxylic acid group in a main chain of methacrylic acid with the epoxy group in glycidyl methacrylate. During the reaction, air was introduced into the reaction solution in a form of bubbles in order to prevent polymerization of glycidyl methacrylate. The developable organic polymer obtained had the solid content of 38% by weight, the acid value of 75 mg KOH/g, and the weight average molecular weight of 10,000. The double bond equivalent of the developable organic polymer was 1,014.

Example 1

Mixed were 2.0 g of a 50% PGMEA solution of tris(2-acryloyloxyethyl) isocyanurate (Fancryl FA-731 A™ from Hitachi Chemical Co., Ltd.), 1.25 g of the polysiloxane solution (i), 1.25 g of the polysiloxane solution (ii), 0.5 g of a 25% PEGMEA solution of 2-methyl-1-[4-(methylthio) phenyl]-2-morpholinopropanone-1-one] (UV-CURE D177™ from Daido Chemical Corporation), 1.25 g of a 10% PEGMEA solution of oligo{2-hydroxy-2-methyl-1-[4-(1-methylvinyl)phenyl]propanone} (ESACURE ONE™ from Lamberti S. p. A.), 0.125 g of Megaface R08 MH™ (from DIC Corporation), 0.25 g of a 50% PEGMEA solution of 3-glycidoxypropyltrimethoxysilane (KBM-403™ from Shin-etsu Chemical Co., Ltd.), and 0.25 g of a 50% PEGMEA solution of ethylene oxide-modified phosphoric acid dimethacrylate (Kayamer PM-21™ from Nihon Kayaku Co., Ltd.), and stirred under yellow light to yield the resin composition 1.

Example 2

Synthesis was performed similarly to Example 1 except the polysiloxane solution (ii) was used instead of the polysiloxane solution (iii), yielding the resin composition 2.

Example 3

Mixed were 2.0 g of a 50% PEGMEA solution of Fancryl FA-731A™, 0.63 g of the polysiloxane solution (i), 1.88 g of the polysiloxane solution (iv), 0.5 g of a 25% PEGMEA solution of UV CURE D177™, 1.25 g of a 10% PEGMEA solution of ESACURE ONE™, 0.125 g of Megaface R08 MH™, 0.25 g of a 50% PEGMEA solution of KBM-403™, and 0.25 g of a 50% PEGMEA solution of Kayamer PM-21™, and stirred under yellow light, yielding the resin composition 3.

Example 4

Synthesis was performed similarly to Example 4 except the polysiloxane solution (ii) was used instead of the polysiloxane solution (i), yielding the resin composition 4.

Example 5

Mixed were 2.0 g of a 50% PEGMEA solution of Fancryl FA-731A, 0.83 g of the polysiloxane solution (i), 0.83 g of the polysiloxane solution (ii), 0.83 g of the polysiloxane solution (v), 0.5 g of a 25% PEGMEA solution of UV CURE D177™, 1.25 g of a 10% PEGMEA solution of ESACURE ONE™, 0.125 g of Megaface R08 MH™, 0.25 g of a 50% PEGMEA solution of KBM-403™, and 0.25 g of a 50% PEGMEA solution of Kayamer PM-21™, and stirred under yellow light, yielding the resin composition 5.

Example 6

Synthesis was performed similarly to Example 5 except the polysiloxane solution (ii) was used instead of the polysiloxane solution (i), yielding the resin composition 6.

Example 7

Synthesis was performed similarly to Example 1 except 1.0 g of a 50% PEGMEA solution of pentaerythritol triacrylate (Aronix M305™ from Toagosei Co., Ltd.) and 1.0 g of a 50% PEGMEA solution of 9,9-bis[4-(2-acryloyloxyethoxy)phenyl]fluorene (Ogsol EA-0200™ from Osaka Gas Chemical Co., Ltd.) were used instead of 2.0 g of a 50% PEGMEA solution of Fancryl FA-731A™ yielding the resin composition 7.

Example 8

Synthesis was performed similarly to Example 1 except 1.0 g of a 50% PEGMEA solution of dipentaerythritol hexaacrylate (Aronix M403™ from Toagosei Co., Ltd.) and 1.0 g of a 50% PEGMEA solution of Ogsol EA-0200™ were used instead of 2.0 g of a 50% PEGMEA solution of Fancryl FA-731A™, yielding the resin composition 8.

Comparative Example 1

Synthesis was performed similarly to Example 1 except a developable organic polymer synthesized in Comparative Synthesis Example 2 was used instead of the polysiloxane solution (iii), yielding the resin composition 9.

Comparative Example 2

Synthesis was performed similarly to Example 1 except 2.50 g of the polysiloxane solution (vi) was used instead of the polysiloxane solution (i) and the polysiloxane solution (ii), yielding the resin composition 10.

Comparative Example 3

Synthesis was performed similarly to Example 5 except 2.19 g of the polysiloxane solution (vi) was used instead of the polysiloxane solution (i) and the polysiloxane solution (ii), yielding the resin composition 11.

[Evaluation]

Using the resin compositions obtained in Examples and Comparative Examples, resin films and post-baked resin films were prepared to evaluate hardness, adhesion to ITO, transparency, and resistance to yellowing.

(1) Preparation of a Resin Membrane Before Post Baking

The resin compositions obtained were each applied to a 10 cm square glass substrate or an ITO substrate by spin coating (with SPINCOATER 1H-DX2™ from Mikasa Co., Ltd.) and then dried under reduced pressure to prepare a thin film. Using a hot plate (Ultra Hot Plate HI-400A™ from AS ONE CORPORATION) the thin film was prebaked at 90° C. for 3 minutes, followed by exposing to light with an exposure unit (Topcon TME-400 Micro Pattern Exposing System™) yielding a film with thickness of 1.7 μm. Subsequently, using a development machine and a developer, the thin film was developed, followed by post-baking in air at 230° C. for 30 minutes to yield a resin film with thickness of 1.5 μm.

(2) Preparation of a Resin Film after Post Baking

The resin films obtained by the method described in (1) were each post-baked at 300° C. in air for 60 minutes, yielding a resin film after post baking.

(3) Determination of Hardness

Pencil hardness of each of the resin films obtained in the method described in (1) was determined according to JIS K 5600-5-4. The results are shown in Table 1 below.

(4) Evaluation of Adhesion to ITO

The resin films obtained by the methods described in (1) and (2) were each prepared on an ITO substrate and adhesion to the ITO surface was evaluated according to the cross cut tape test method of JIS K 5400-8.5 (JIS D 0202). The grid area which was peeled off was classified as follows to rate the adhesion. The results are shown in Table 1 below.
5: Cross-cut area=0%
4: Cross-cut area=Above 0% but 5% or less
3: Cross-cut area=Above 5% but 15% or less
2: Cross-cut area=Above 15% but 35% or less
1: Cross-cut area=Above 35% but 65% or less
0: Cross cut area=Above 65% but 100% or less (5) Evaluation of Transparency Using the resin films with thickness of 1.5 μm each obtained by the methods in (1) and (2) described above, transmittance at wavelength of 400 nm was determined to rate its transparency according to the following criteria. The results are shown in Table 1 below.
○: Transmittance of 97% or more
Δ: Transmittance of 94% or more but transmittance below 97%
X: Transmittance below 94%

(6) Evaluation of Resistance to Yellowing

The La*b* color space of each of the resin films obtained by the method (2) described above was determined and resistance to yellowing was rated according to the following criteria. The results are shown in Table 1 below.
○: −1.0<a*<1.0 and −1.0<b*<1.0
Δ: −1.5<a*≤−1.0 or 1.0≤a*<1.5 and −1.5<b*≤−1.0 or 1.0≤b*<1.5
X: −1.5≥a* or 1.5≥a* or −1.5≥b* or 1.5≤b*

TABLE 1

| Measuring Object | Pencil Hardness Before Post Baking | Adhesion to ITO | | Transparency | | Resistance to yellowing After Post Baking |
|---|---|---|---|---|---|---|
| | | Before Post Baking | After Post Baking | Before Post Baking | After Post Baking | |
| Example 1 | 4 H | 5 | 5 | ○ | ○ | ○ |
| Example 2 | 4 H | 5 | 5 | ○ | ○ | ○ |
| Example 3 | 4 H | 5 | 5 | ○ | ○ | ○ |
| Example 4 | 5 H | 5 | 5 | ○ | ○ | ○ |
| Example 5 | 4 H | 5 | 5 | ○ | ○ | ○ |
| Example 6 | 4 H | 5 | 5 | ○ | ○ | ○ |
| Example 7 | 4 H | 5 | 3 | ○ | Δ | Δ |
| Example 8 | 4 H | 5 | 3 | ○ | Δ | Δ |
| Comparative Example 1 | 4 H | 5 | 0 | ○ | X | X |
| Comparative Example 2 | 5 H | 5 | 0 | ○ | ○ | ○ |
| Comparative Example 3 | 4 H | 5 | 1 | ○ | ○ | ○ |

It was confirmed from Table 1 that resin films excellent in hardness and heat resistance can be formed in Examples.

REFERENCE SIGNS LIST

1: Transparent substrate
2: Sensor electrode
2a: First electrode
2b: Second electrode
3: Inter-electrode insulation layer
4: Overcoat layer
6: Routing wire
10: Transparent membrane for a touch panel
20: Touch panel

The invention claimed is:
1. A resin composition comprising:
   a developable polysiloxane containing a developable group and substantially no radically polymerizable group,
   a polymerizable polysiloxane containing a radically polymerizable group and substantially no developable group, and
   a polyfunctional monomer,
   wherein the polyfunctional monomer is a compound having a triazine ring skeleton.
2. A resin composition comprising:
   a developable polysiloxane containing a developable group and substantially no radically polymerizable group,
   a polymerizable polysiloxane containing a radically polymerizable group and substantially no developable group, and
   a polyfunctional monomer,
   wherein the resin composition has a phosphate compound.

* * * * *